United States Patent
Won

(10) Patent No.: US 7,220,687 B2
(45) Date of Patent: May 22, 2007

(54) METHOD TO IMPROVE WATER-BARRIER PERFORMANCE BY CHANGING FILM SURFACE MORPHOLOGY

(75) Inventor: Tae Kyung Won, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 10/876,440

(22) Filed: Jun. 25, 2004

(65) Prior Publication Data

US 2005/0287686 A1    Dec. 29, 2005

(51) Int. Cl.
*H01L 21/31* (2006.01)
(52) U.S. Cl. .................... 438/792; 427/579
(58) Field of Classification Search ............ 438/475, 438/485, 788, 791, 792, 902, 775–777; 257/E51.018, 257/E51.022, E51.026; 427/533, 536, 579, 427/255.23, 255.394, 255.18, 376.2, 397.7
See application file for complete search history.

(56) References Cited

U.S. PATENT DOCUMENTS

| | | | |
|---|---|---|---|
| 5,339,387 A | 8/1994 | Frankel |
| 5,438,222 A | 8/1995 | Yamazaki |
| 5,593,741 A | 1/1997 | Ikeda |
| 5,733,610 A | 3/1998 | Okazaki et al. |
| 6,055,927 A | 5/2000 | Shang et al. |
| 6,337,102 B1 | 1/2002 | Forrest et al. |
| 6,506,691 B2 | 1/2003 | Cook et al. |
| 6,645,884 B1 | 11/2003 | Yang et al. |

6,699,739 B2    3/2004    Yamazaki et al.

(Continued)

FOREIGN PATENT DOCUMENTS

EP    1 365 389 A    11/2003

(Continued)

OTHER PUBLICATIONS

Nakayama et al., "Physical Properties of diamondlike carbon films deposited in mixed atmospheres of $C_2H_4$—Ar, $C_2H_4$—$H_2$, and $C_2H_4$—$N_2$", *J. Vac. Sci. Technol.* (1996) 2418-2426.

(Continued)

*Primary Examiner*—David Vu
(74) *Attorney, Agent, or Firm*—Patterson & Sheridan LLP

(57) ABSTRACT

A method and apparatus for depositing a material layer onto a substrate is described. The method includes placing the substrate in a process chamber, delivering a mixture of precursors for the material layer into the process chamber, delivering a hydrogen gas into the process chamber to improve water-barrier performance of the material layer, controlling the temperature of the substrate to a temperature of about 100° C. or lower, applying an electric field and generating a plasma inside the process chamber, and depositing the material layer on the substrate. The material layer can be used as an encapsulating layer for various display applications which require low temperature deposition process due to thermal instability of underlying materials used. The encapsulating layer thus deposited provides reduced surface roughness, improved water-barrier performance which can be applied to any substrate type including wafer, glass, and plastic film (e.g., PET, PEN, etc.) and any substrate size in the flat panel industry.

32 Claims, 6 Drawing Sheets

U.S. PATENT DOCUMENTS

| | | | |
|---|---|---|---|
| 6,710,542 | B2 | 3/2004 | Chun et al. |
| 6,770,562 | B2 | 8/2004 | Yamazaki et al. |
| 6,791,129 | B2 | 9/2004 | Inukai |
| 6,991,859 | B2 | 1/2006 | Klubek et al. |
| 7,074,640 | B2 | 7/2006 | Maloney et al. |
| 2003/0159656 | A1 | 8/2003 | Tan et al. |
| 2004/0113542 | A1* | 6/2004 | Hsiao et al. ............... 313/504 |
| 2004/0262613 | A1* | 12/2004 | Maekawa et al. ............. 257/72 |
| 2006/0158101 | A1 | 7/2006 | Camilletti et al. |

FOREIGN PATENT DOCUMENTS

| | | |
|---|---|---|
| JP | 61218135 | 9/1986 |
| JP | 2003197636 | 7/2003 |
| WO | WO 00/15869 A | 3/2000 |

OTHER PUBLICATIONS

Ronald M. Kubacki, "Low Temperature Plasma Deposition of Silicon Nitride to Produce Ultra-Reliable, High Performance, Low Cost Sealed Chip-on-Board (SCOB) Assemblies", IEEE/CPMT Intl Electronics Manufacturing Technology Symposium 1994, pp. 273-280.

Yoshimi et al., "Amorphous Carbon Basis Blue Light Electroluminescent Device", *Optoelectronics Devices and Technologies, Mita Press,* vol. 7, Nos. 1 Jun. 1992, pp. 69-81.

International Search Report dated Dec. 20, 2005 for corresponding PCT application, PCT/US2005/020079.

Huang et al., "Low Temperature PECBD SiN, Films Applied in OLED Packaging", *Materials Science and Engineering 898* (2003) 248-254.

Kathleen M. Vaeth, "OLED-Display Technology", *Information Display,* Jun. 2003, pp. 12-17.

Tao Peng et al., "Silicon Nitride Thin Films Packaging for Flexible Organic Light Emitting Devices", *International Journal of Modern Physics B*, vol. 16, Nos. 6 & 7 (2002) pp. 1052-1056.

P.E. Burrows et al., "Gas Permeation and Lifetime Tests on Polymer-Based Barrier Coatings" *SPIE Annual Meeting, Invited Paper,* Aug. 30, 2000, pp. 1-9.

\* cited by examiner

METHOD TO IMPROVE WATER-BARRIER PERFORMANCE BY CHANGING FILM SURFACE MORPHOLOGY

BACKGROUND OF THE INVENTION

1. Field of the Invention

Embodiments of the present invention generally relate to the deposition of thin films using chemical vapor deposition processing. More particularly, this invention relates to a process for depositing thin films onto large area substrates.

2. Description of the Related Art

Organic light emitting diode (OLED) displays have gained significant interest recently in display applications in view of their faster response times, larger viewing angles, higher contrast, lighter weight, lower power and amenability to flexible substrates, as compared to liquid crystal displays (LCD). After efficient electroluminescence (EL) was reported by C. W. Tang and S. A. Van Slyke in 1987 practical application of OLED is enabled by using two layers of organic materials sandwiched between two electrodes for emitting light. The two organic layers, in contrast to the old single organic layer, include one layer capable of monopolar (hole) transport and the other layer for electroluminescence and thus lower the required operating voltage for OLED display.

In addition to organic materials used in OLED, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel display, electrically pumped organic laser, and organic optical amplifier.

Over the years, layers in display devices have evolved into multiple layers with each layer serving different function. FIG. 1 shows an example of an OLED device structure built on a substrate 101. After a transparent anode layer 102, such as an indium tin oxide (ITO) layer, is deposited on the substrate 101, a stack of organic layers are deposited on the anode layer 102. The organic layers could comprise a hole-injection layer 103, a hole-transport layer 104, an emissive layer 105, an electron-transport layer 106 and an electron injection layer 107. It should be noted that not all 5 layers of organic layers are needed to build an OLED cell. For example, in some cases, only a hole-transport layer 104 and an emissive layer 105 are needed. Following the organic layer deposition, a metallic cathode 108 is deposited on top of the stack of organic layers. When an appropriate voltage 110 (typically a few volts) is applied to the cell, the injected positive and negative charges recombine in the emissive layer to produce light 120 (electroluminescence). The structure of the organic layers and the choice of anode and cathode are designed to maximize the recombination process in the emissive layer, thus maximizing the light output from the OLED devices.

The lifetime of display devices can be limited, characterized by a decrease in EL efficiency and an increase in drive voltage, due to the degradation of organic or polymer materials, the formation of non-emissive dark spots, and crystallization of the organic layers at high temperature of about 55° C. or higher, e.g., crystallization of the hole transport materials can occur at room temperature. Therefore, a low temperature deposition process for these materials, such as at about 80° C. or lower is needed. In addition, the main reason for the material degradation and dark spot problems is moisture and oxygen ingress. For example, exposure to humid atmospheres is found to induce the formation of crystalline structures of 8-hydroxyquinoline aluminum ($Alq_3$), which is often used as the emissive layer, resulting in cathode delamination, and hence, creating non-emissive dark spots growing larger in time. In addition, exposure to air or oxygen may cause cathode oxidation and once organic material reacts with water or oxygen, the organic material is dead.

Currently, most display manufacturers use metal-can or glass-can materials as an encapsulation layer to protect organic materials in the device from water ($H_2O$) or oxygen ($O_2$) attack. FIG. 2 illustrates the conventional packaging of an OLED device 200 on a substrate 201 with glass or metal encapsulating materials 205. The device 200 includes an anode layer 202 and a cathode layer 204 with multiple layers of organic materials 203. The metal or glass materials 205 are attached to the substrate 201 like a lid using a bead of UV-curved epoxy 206. However, moisture can easily penetrate through the epoxy 206 and damage the device 200.

Other materials, such as inorganic materials, e.g., silicon nitride (SiN), silicon oxynitride (SiON) and silicon oxide (SiO), prepared by plasma enhanced chemical vapor deposition (PECVD), can also be used as an effective encapsulation/barrier layer against moisture, air and corrosive ions for such devices. However, it is very difficult to generate water-barrier inorganic encapsulation materials using a low temperature deposition process because the resulting film is less dense and has high defect pinhole structures. It is important to note that the presence of residual moisture in the organic layers may also promote the $Alq_3$ crystallization process even in encapsulated devices. Therefore, a good encapsulation/barrier film also requires low water vapor transmission rate (WVTR).

Thus, there is still a need for methods of depositing low temperature encapsulation/barrier films onto large area plastic substrate with improved water-barrier performance to protect the devices underneath.

SUMMARY OF THE INVENTION

Embodiments of the invention generally provide a method and apparatus for depositing an encapsulating film onto a substrate. In one embodiment, a method for depositing a material layer onto a substrate includes placing the substrate in a process chamber, delivering a mixture of precursors for the material layer into the process chamber, delivering a hydrogen gas into the process chamber to improve water-barrier performance of the material layer, controlling the temperature of the substrate to a temperature of about 100° C. or lower, applying an electric field and generating a plasma inside the process chamber, and depositing the material layer on the substrate.

In another embodiment, a method of depositing a material layer onto a substrate includes placing the substrate in a process chamber, applying an electric field and generating a plasma inside the process chamber, depositing the material layer onto the substrate from a mixture of precursors for the material layer and at a substrate temperature of about 100° C. or lower; and reducing the surface roughness of the deposited material layer into roughness measurement of about 40 Å or less (in RMS=Root Mean Square surface roughness unit) by delivering a hydrogen gas into the process chamber during deposition.

In yet another embodiment, a method for depositing an encapsulating layer onto a substrate is provided. The method includes placing the substrate in a process chamber, delivering a mixture of precursors for the encapsulating layer into the process chamber, delivering a hydrogen gas into the process chamber, and controlling the temperature of the substrate to a temperature of about 100° C. or lower. The method further includes applying an electric field and generating a plasma inside the process chamber, and depositing the encapsulating layer with water-barrier performance of water vapor transmission rate of about $1\times10^{-2}$ grams per square meter per day (1E-2 g/m² day) onto the substrate.

In still another embodiment, an apparatus to deposit a low temperature material layer onto a substrate is also provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to a method of improving water-barrier performance between a substrate and a film/layer deposited thereon. The invention describes using a hydrogen gas to reduce film surface roughness resulting in smooth film surface. The smooth surface of the deposited film prevents water and oxygen penetrating from atmosphere into the film and shows much lower WVTR (Water Vapor Transmission Rate) value. WVTR is a key parameter to indicate water-barrier performance in the Flat Panel Display (FPD) industry.

Substrates of the invention can be circular or polygonal for semiconductor wafer manufacturing and flat panel display manufacturing. The surface area of a rectangular substrate for flat panel display is typically large, for example a rectangle of at least about 300 mm by about 400 mm. In addition, the invention applies to any devices, such as OLED, FOLED, PLED, organic TFT, solar cell, etc., and can be on any of the silicon wafers, glass substrates or plastic films (e.g., polyethylene terephthalate (PET), polyethylene naphthalate (PEN), etc.).

The invention is illustratively described below in reference to a plasma enhanced chemical vapor deposition system configured to process large area substrates, such as various parallel-plate radio-frequency (RF) plasma enhanced chemical vapor deposition (PECVD) systems including AKT 1600, AKT 3500, AKT 4300, AKT 5500, AKT 10K, AKT 15K, and AKT 25K for various substrate sizes, available from AKT, a division of Applied Materials, Inc., Santa Clara, Calif. However, it should be understood that the invention has utility in other system configurations, such as other chemical vapor deposition systems and any other film deposition systems, including those systems configured to process round substrates.

Figure 1:
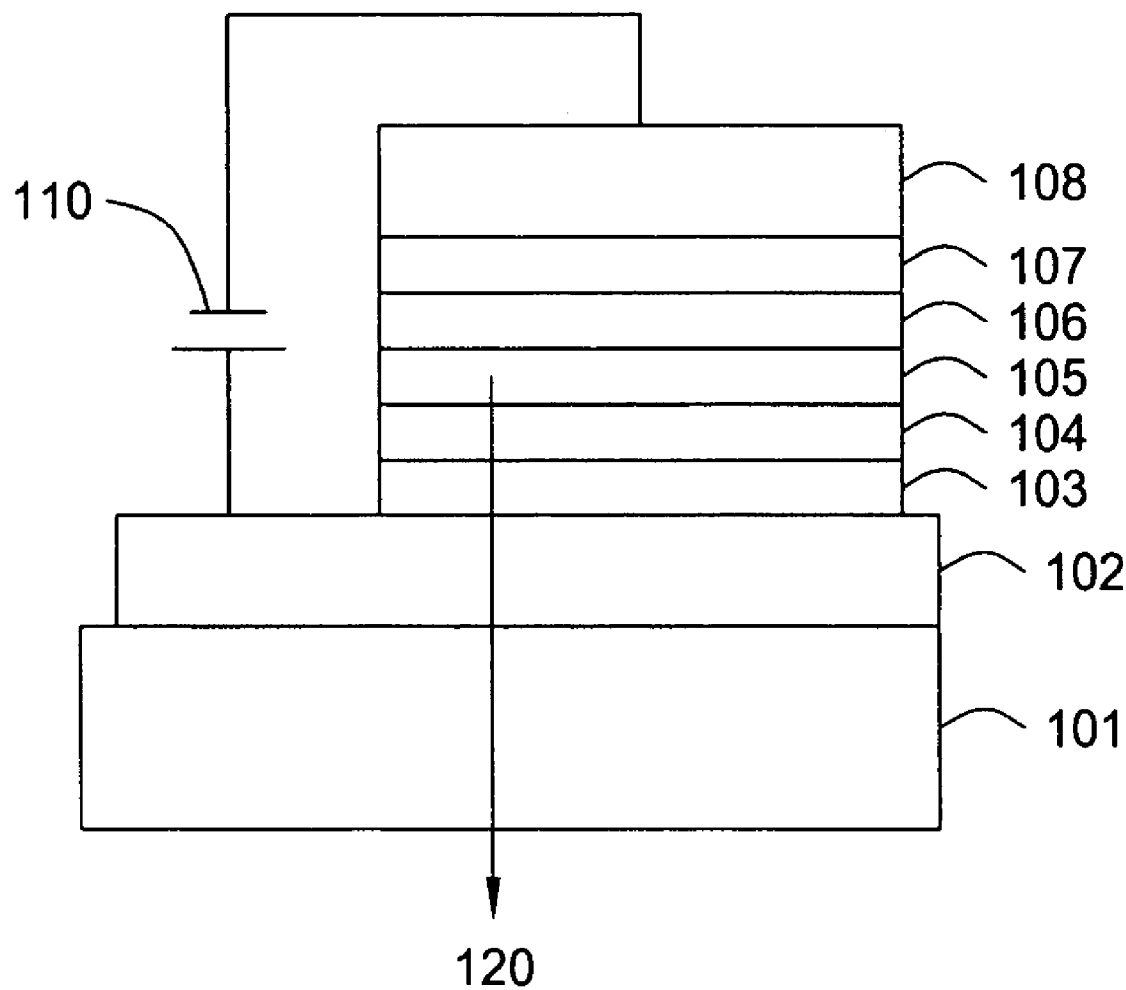
FIG. 1 depicts a cross-sectional schematic view of an OLED device.
Figure 2:
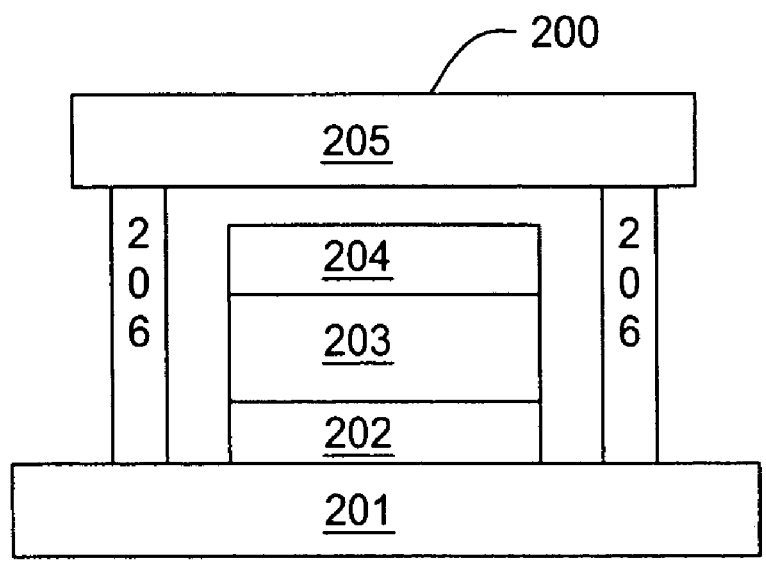
FIG. 2 depicts a cross-sectional schematic view of an OLED device with an encapsulating material (glass or metal) attached on top.
Figure 3:
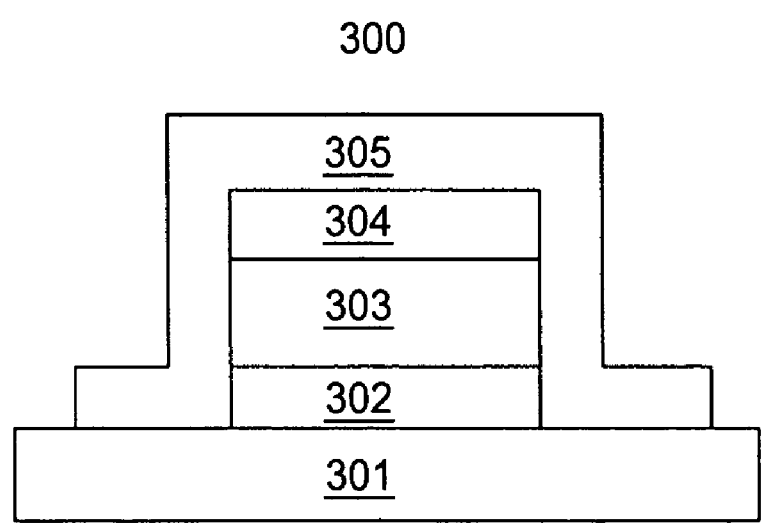
FIG. 3 depicts a cross-sectional schematic view of an OLED device with an encapsulating layer deposited on top in accordance with one embodiment of the invention.

FIG. 3 shows an exemplary embodiment of an encapsulating layer 305 deposited on a substrate 301 of a display device 300 using methods of the invention. For example, a transparent anode layer 302 is deposited on the substrate 301, which could be made of glass or plastic, such as polyethyleneterephthalate (PET) or polyethyleneterephthalate (PEN). An example of the transparent anode layer 302 is an indium-tin-oxide (ITO) with the thickness in the range of about 200 Å to about 2000 Å.

Then, multiple layers of organic or polymer materials 303 can be deposited on top of the anode layer 302. For example, a material layer 303 can include a hole-transport layer deposited on top of the anode layer. Examples of the hole-transport layer include: diamine, such as a naphthyl-substituted benzidine (NPB) derivative, or N,N'-diphenyl-N,N'-bis(3-methylphenyl)-(1,1'-biphenyl)-4,4'-damine (TPD), for a thickness of about 200 Å to about 1000 Å. Following the hole-transport layer deposition, an emissive layer can be deposited. Materials for the emissive layer typically belong to a class of fluorescent metal chelated complexes. An example is 8-hydroxyquinoline aluminum ($Alq_3$). The thickness of the emissive layer is typically in the range of about 200 Å to about 1500 Å. After the emissive layer is deposited, these organic layers are patterned. OLED displays are typically deposited on a pre-patterned surface of the substrate by ink-jet printing or evaporation method.

After patterning of the organic materials 303, a top electrode layer 304, such as a cathode layer, is then deposited and patterned. The top electrode layer 304 can be a metal, a mixture of metals or an alloy of metals. An example of the top electrode material is an alloy of magnesium (Mg), silver (Ag) and aluminum (Al) in the thickness range of about 1000 Å to about 3000 Å. After construction of the display device 300, such as an OLED device, is complete, an encapsulating layer 305 is deposited. Exemplary materials of the encapsulating layer 305 of the invention include inorganic nitride film, inorganic oxide film, and polymer-type organic film deposited in the thickness range of about 500 Å to about 20000 Å. For example, silicon nitride (SiN), silicon oxynitride (SiON), and silicon oxide (SiO), among others, can be used as the encapsulating material.

Figure 4:
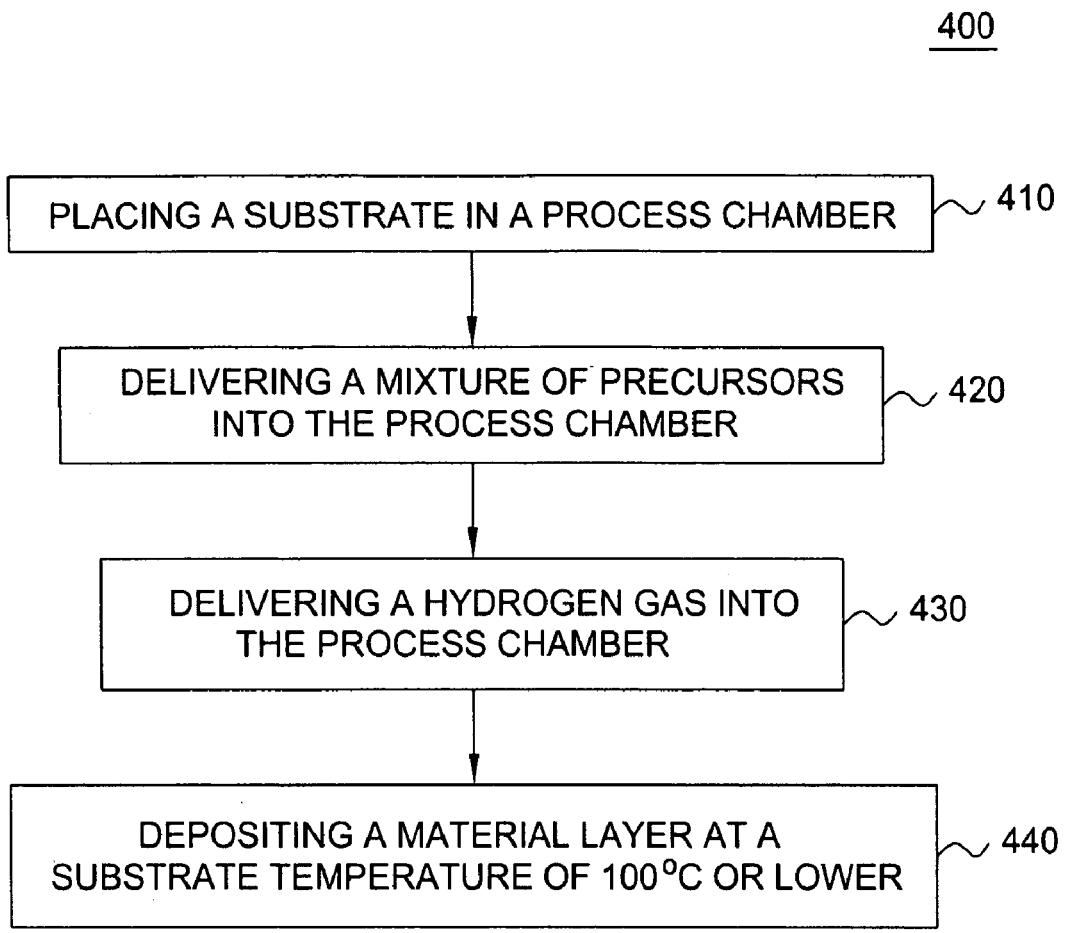
FIG. 4 is a flow chart of the method of depositing a thin film on a substrate inside a process chamber in accordance with one embodiment of the invention.

FIG. 4 illustrates a flow chart of a deposition method 400 in accordance with one embodiment of the invention. At step 410, a substrate is placed in a deposition process chamber for depositing a material layer, such as an encapsulating layer 305 on the substrate. The method 400 optionally includes a step of forming a device on the substrate. Exemplary devices include, but is not limited to, OLED, PLED, and FOLED, among others.

At step 420, a mixture of precursors for the material layer is delivered into the process chamber. The precursors may include a silicon-containing precursor, such as silane ($SiH_4$), $Si_2H_6$, $SiF_4$, among others, for depositing a layer of silicon nitride (SiN), silicon oxynitride (SiON) or silicon oxide (SiO), among others, as an encapsulating layer onto the substrate. The silicon-containing precursor can be delivered, for example, at a flow rate of 10 sccm or larger, such as between about 100 sccm to about 500 sccm for a substrate size of about 400 mm×about 500 mm.

The precursors may further include a nitrogen-containing precursor, including, but not limited to, ammonium ($NH_3$), nitrous oxide ($N_2O$), nitric oxide (NO), nitrogen ($N_2$) and combinations thereof. The nitrogen-containing precursor can be delivered at a flow rate of about 5 sccm or larger, such as between about 100 sccm to about 6000 sccm for various nitrogen-containing precursors.

For example, a mixture of the precursors may include silane, nitrous oxide, and nitrogen, among others, for depositing a silicon oxynitride film. Alternatively, silane, ammonium, and nitrogen, among others are used for depositing a silicon nitride film. Also, the precursors may include silane, and nitrous oxide for depositing a silicon oxide film. In addition, each precursor can be delivered at different or the same flow rate, depending on various deposition parameters required. It is understood that embodiments of the invention include scaling up or scaling down any of the process parameter/variables as described herein according to substrate sizes, chamber conditions, etc., among others.

At step 430, a hydrogen gas is delivered into the process chamber to improve water-barrier performance of the material layer. In addition, the introduction of the hydrogen gas is found to reduce surface roughness of the material layer deposited on the substrate, such as from a surface roughness measurement (RMS) of between about 40 Å to about 70 Å being reduced to about 40 Å or lower, such as about 15 Å or lower, preferably about 10 Å or lower. We have also found that a material layer with reduced surface roughness (a smooth surface) significantly prevents water penetration into the material layer, making it a good encapsulating layer for any materials (e.g., organic and/or polymer materials used for display devices) underneath. The introduction of hydrogen gas prevents water penetration with a water vapor transmission rate of less than about $1\times10^{-2}$ grams per square meter per day, such as between about $1\times10^{-3}$ grams per square meter per day to about $1\times10^{-4}$ grams per square meter per day as measured at about 38° C. with 90% relative humidity.

At step 440, the material layer is deposited onto the substrate at a substrate temperature of about 100° C. or lower, such as between about 20° C. to about 80° C. by applying an electric field and generating a plasma inside the process chamber. The electric field can be generated by applying a power source, such as radiofrequency power, microwave frequency power, to the process chamber. The power source can be coupled to the process chamber inductively or capacitively. In addition, the pressure of the process chamber is maintained at about 0.5 Torr to about 10 Torr. As a result, the material layer is deposited at a deposition rate of about 500 Å/min or larger, such as between about 1000 Å/min to about 2000 Å/min. The thickness of the deposited material layer, such as an encapsulating layer for display applications, is variable to a range of from about 5000 Å to about 30000 Å, usually thicker encapsulation layer is better than thinner thickness to prevent water penetration. It is noted that embodiments of the invention do not require the steps to be performed in the order as described herein. For example, a hydrogen gas can be delivered into the process chamber before a mixture of the precursors is delivered into the chamber, and in some cases, steps 420 and 430 can be performed at the same time.

Figure 5:
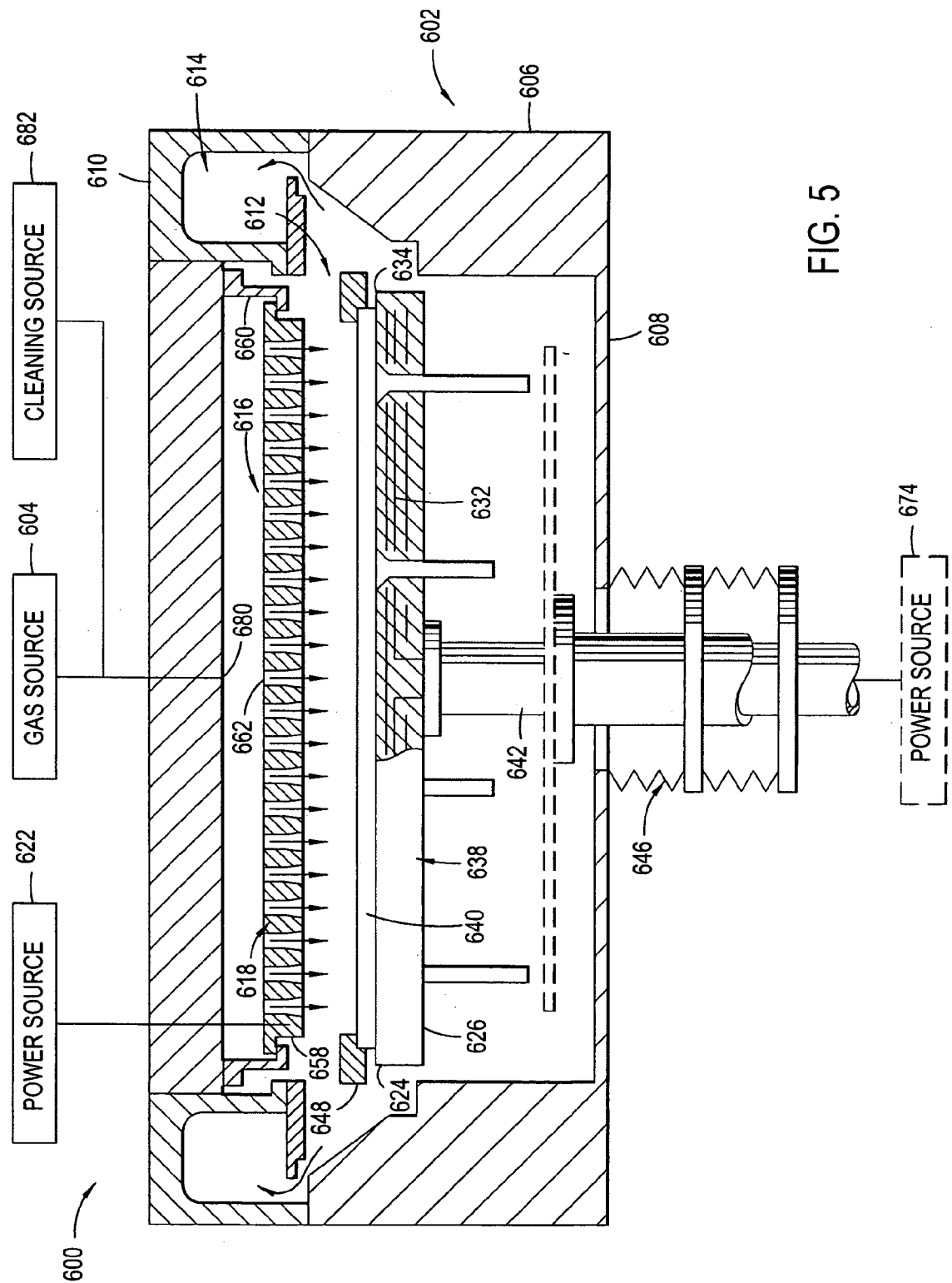
FIG. 5 is a schematic cross-sectional view of one embodiment of a process chamber in accordance with the invention.

FIG. 5 is a schematic cross-sectional view of one embodiment of a plasma enhanced chemical vapor deposition system 600, available from AKT, a division of Applied Materials, Inc., Santa Clara, Calif. The system 600 generally includes a processing chamber 602 coupled to a gas source 604. The processing chamber 602 has walls 606 and a bottom 608 that partially define a process volume 612. The process volume 612 is typically accessed through a port and a valve (not shown) to facilitate movement of a substrate 640 into and out of the processing chamber 602. The walls 606 support a lid assembly 610 that contains a pumping plenum 614 that couples the process volume 612 to an exhaust port (that includes various pumping components, not shown) for exhausting any gases and process by-products out of the processing chamber 602.

A temperature controlled substrate support assembly 638 is centrally disposed within the processing chamber 602. The substrate support assembly 638 supports the substrate 640 during processing. The substrate support assembly 638 comprises an aluminum body 624 that encapsulates at least one embedded heater 632. The heater 632, such as a resistive element, disposed in the substrate support assembly 638, is coupled to an optional power source 674 and controllably heats the support assembly 638 and the substrate 640 positioned thereon to a predetermined temperature.

In one embodiment, the temperature of the heater 632 can be set at about 100° C. or lower, such as between about 20° C. to about 80° C., depending on the deposition processing parameters for the material layer being deposited. For example, the heater can be set at about 60° C. for a low temperature deposition process.

In another embodiment, a port having hot water flowing therein is disposed in the substrate support assembly 638 to maintain the glass substrate 640 at a uniform temperature of 100° C. or lower, such as between about 20° C. to about 80° C. Alternatively, the heater 632 can be turned off with only hot water flowing inside the substrate support assembly 638 to control the temperature of the substrate during deposition, resulting in a substrate temperature of about 80° C. or lower for a low temperature deposition process.

The support assembly 638 generally is grounded such that RF power supplied by a power source 622 to a gas distribution plate assembly 618 positioned between the lid assembly 610 and substrate support assembly 638 (or other electrode positioned within or near the lid assembly of the chamber) may excite gases present in the process volume 612 between the support assembly 638 and the gas distribution plate assembly 618. The RF power from the power source 622 is generally selected commensurate with the size of the substrate to drive the chemical vapor deposition process.

In one embodiment, a RF power of about 10 W or larger, such as between about 400 W to about 5000 W, is applied to the power source 622 to generate an electric field in the process volume 612. The power source 622 and matching network (not shown) create and sustain a plasma of the process gases from the precursor gases in the process volume 612. Preferably high frequency RF power of 13.56 MHz can be used, but this is not critical and lower frequencies can also be used. Further, the walls of the chamber can be protected by covering with a ceramic material or anodized aluminum material.

Generally, the support assembly 638 has a lower side 626 and an upper side 634, supporting the substrate 640. The lower side 626 has a stem 642 coupled thereto and connected to a lift system (not shown) for moving the support assembly 638 between an elevated processing position (as shown) and a lowered substrate transfer position. The stem 642 additionally provides a conduit for electrical and thermocouple leads between the support assembly 638 and other components of the system 600. A bellows 646 is coupled to the substrate support assembly 638 to provide a vacuum seal between the process volume 612 and the atmosphere outside the processing chamber 602 and facilitate vertical movement of the support assembly 638.

In one embodiment, the lift system is adjusted such that a spacing between the substrate and the gas distribution plate assembly 618 is about 400 mils or larger, such as between about 400 mils to about 1600 mils during processing. The ability to adjust the spacing enables the process to be optimized over a wide range of deposition conditions, while maintaining the required film uniformity over the area of a large substrate. The combination of a grounded substrate support assembly, a ceramic liner, high pressures and close spacing gives a high degree of plasma confinement between the gas distribution plate assembly 618 and the substrate support assembly 638, thereby increasing the concentration of reactive species and the deposition rate of the subject thin films.

The support assembly 638 additionally supports a circumscribing shadow frame 648. Generally, the shadow frame 648 prevents deposition at the edge of the glass substrate 640 and support assembly 638 so that the substrate does not stick to the support assembly 638. The lid assembly 610 typically includes an entry port 680 through which process gases provided by the gas source 604 are introduced into the processing chamber 602. The entry port 680 is also coupled to a cleaning source 682. The cleaning source 682 typically provides a cleaning agent, such as disassociated fluorine, that is introduced into the processing chamber 602 to remove deposition by-products and films from processing chamber hardware, including the gas distribution plate assembly 618.

The gas distribution plate assembly 618 is typically configured to substantially follow the profile of the glass substrate 640, for example, polygonal for large area substrates and circular for wafers. The gas distribution plate assembly 618 includes a perforated area 616 through which precursors and other gases, such as hydrogen gas, supplied from the gas source 604 are delivered to the process volume 612. The perforated area 616 is configured to provide uniform distribution of gases passing through the gas distribution plate assembly 618 into the processing chamber 602. The gas distribution plate assembly 618 typically includes a diffuser plate 658 suspended from a hanger plate 660. A plurality of gas passages 662 are formed through the diffuser plate 658 to allow a predetermined distribution of gas passing through the gas distribution plate assembly 618 and into the process volume 612.

Gas distribution plates that may be adapted to benefit from the invention are described in commonly assigned U.S. patent application Ser. No. 09/922,219, filed Aug. 8, 2001 by Keller et al., and published as United States Patent Publication No. 2002/0069968 A1; Ser. No. 10/140,324, filed May 6, 2002; and Ser. No. 10/337,483, filed Jan. 7, 2003 by Blonigan et al., and published as United States Patent Publication No. 2003/0207033 A1; U.S. Pat. No. 6,477,980, issued Nov. 12, 2002 to White et al.; and U.S. patent application Ser. No. 10/417,592, filed Apr. 16, 2003 by Choi et al., and published as United States Patent Publication No. 2004/0206305 A1, which are hereby incorporated by reference in their entireties.

Although the invention has been described in accordance with certain embodiments and examples, the invention is not meant to be limited thereto. The CVD process herein can be carried out using other CVD chambers, adjusting the gas flow rates, pressure and temperature so as to obtain high quality films at practical deposition rates.

Conventional low temperature inorganic film deposition processes have produced undesired properties in an encapsulating layer. For example, the film is less dense and the surface of the film is rough with defect structure and poor film property, such as high refractive index change after water test, high transmission fourier transform infrared spectra (FTIR) change, high water vapor transmission rate (WVTR) after water test. As an example, deposition of a silicon nitride thin film with good water-barrier performance to be used as a good moisture barrier/film will be further illustrated hereinbelow, but the invention is not meant to be limited to the details described herein.

Substrates (400 mm×500 mm in size) were brought under vacuum inside a chamber of a conventional parallel-plate radio-frequency (RF) plasma enhanced chemical vapor deposition (PECVD) system, AKT 1600 PECVD, available from Applied Materials, Inc., Santa Clara, Calif. with a spacing of about 900 mils. The temperature of the substrate support (susceptor) was set at about 60° C. for a low temperature deposition process. Mixtures of silane ($SiH_4$), ammonium ($NH_3$), nitrogen ($N_2$) in the presence of hydrogen gas ($H_2$) were delivered into the chamber as the source precursor gases for depositing a silicon nitride film as moisture and oxygen barrier. As a comparison, prior art methods of using silane ($SiH_4$), ammonium ($NH_3$), and a nitrogen ($N_2$) for depositing silicon nitride was prepared in parallel under the same process conditions. The pressure inside the chamber is about 2.1 Torr. A plasma was sustained with RF power generator set at about 13.56 MHz and about 900 W.

Basic film properties were compared for films prepared from both process conditions. The results showed that silicon nitride films deposited in the presence and absence of hydrogen source gas exhibit similar basic film properties initially with refractive index (RI) of about 1.7 to about 1.9 and film stress of zero to about $2 \times 10^9$ dynes/cm$^2$. The deposition rate is comparable for both films at about 1000 Å/min to about 1500 Å/min. Thus, the presence of hydrogen gas does not affect basic film properties or the deposition rate.

However, surface roughness after deposition (in the unit of root mean square, RMS) for both films varied dramatically. Both films were compared under microscope, and 3-dimentional surface roughness images were compared and surface roughness was measured. The average surface roughness for SiN film deposited without hydrogen source gas was about 40 Å to about 70 Å, indicating a rough surface. The average surface roughness for SiN film deposited in the presence of hydrogen source gas was about 9 Å to about 12 Å, indicating a smooth surface.

The comparison was more significant when both films were compared after water test to measure the effect of water/moisture on film property. According to Table 1 for a comparison of key water-barrier performance, it is found that $H_2$ source gas plays an important role to reduce film surface roughness into a smooth surface, and a smooth surface prevents water/oxygen penetration from atmosphere into the film inside, resulting in much lower WVTR (Water Vapor Transmission Rate) value, a key parameter in the flat panel display industry to indicate resistance to moisture/water. Water test is a high-humidity test usually carried out in a humidity chamber operating at a temperature range of about 25° C. to about 100° C. and about 40% to about 98% relative humidity (RH).

Figure 6A:
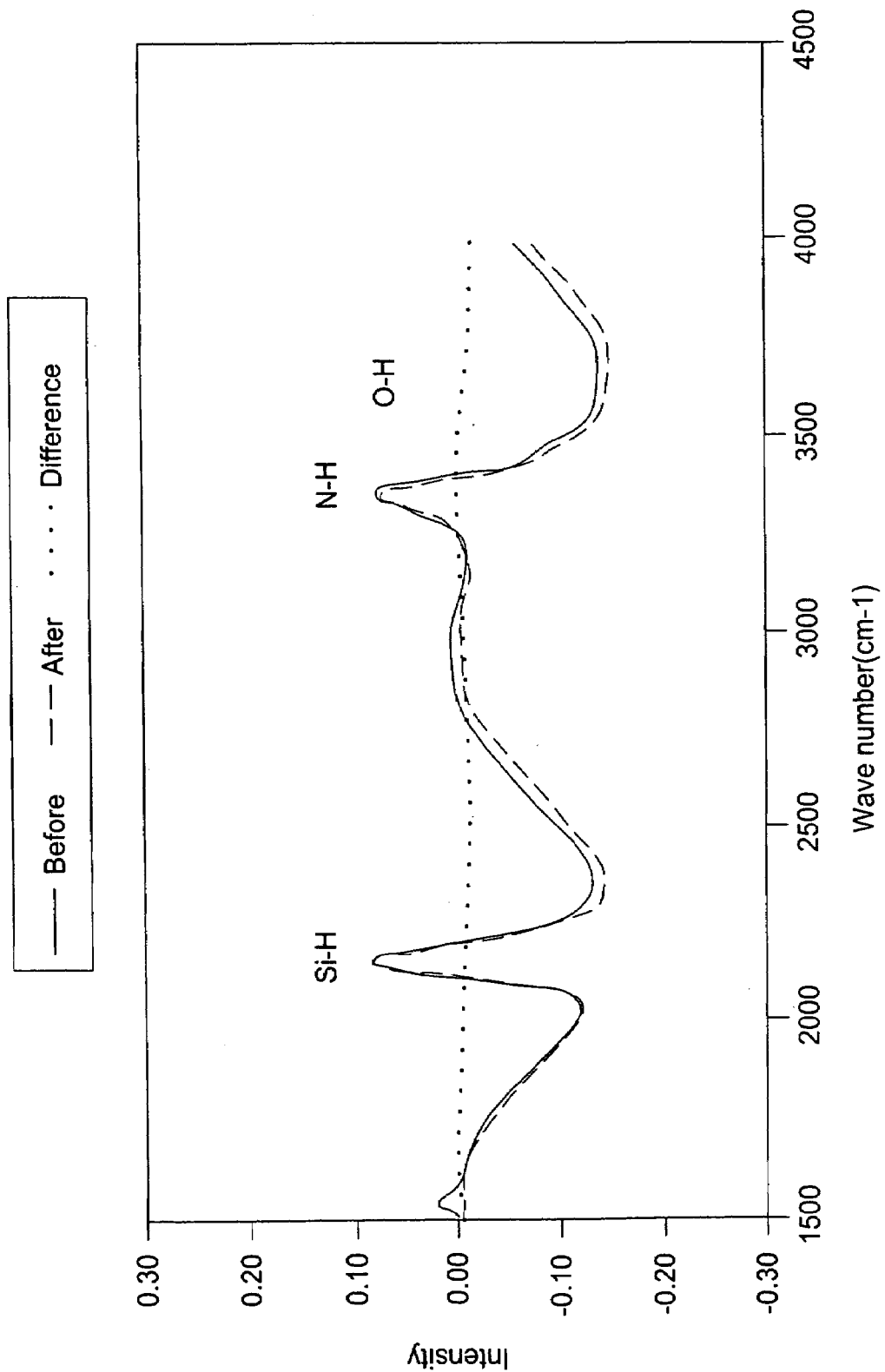
FIG. 6A illustrates the transmission fourier transform infrared spectra (FTIR) of the silicon nitride film deposited with hydrogen source gas.

FIG. 6A illustrates the transmission fourier transform infrared spectra (FTIR) before (solid line) and after (broken line) water treatment for the SiN film deposited with hydrogen source gas. The spectra were recorded in the range of 1500 cm$^{-1}$ to 4000 cm$^{-1}$. The Si—H, N—H, and O—H bonds were indicated in the spectra. The difference before and after water treatment is shown as the dotted line, which is very flat, indicating no change of any bonds after water test from this film. The results of Table 1 and FIG. 6A also indicated that, after treatment of the SiN film in water at about 100° C. for about 100 hours (hot and humid), there is no change of refractive index for the SiN film deposited under the deposition conditions in the presence of hydrogen gas as one of the precursor source gases. In addition, low water vapor transmission rate (WVTR) was measured after water test. All of which are indicative that a high quality silicon nitride was deposited with good water-barrier performance.

TABLE 1

Comparison of key water-barrier performance

|  | SiN film without H2 | SiN film with H2 |
|---|---|---|
| Surface roughness after deposition (RMS) | about 40 Å to about 70 Å | about 9 Å to about 12 Å |
| Refractive Index (RI) change after water test (100° C./100 hours) | 15% | 0% |
| FTIR change after water test (100° C./100 hours) | O—H bond increased, Si—H bond reduced, N—H bond reduced | No change |
| Water Vapor Transmission Rate (WVTR) at 38° C./ 90% relative humidity | More than about $1.0 \times 10^{-2}$ g/m$^2$day | About $1.0 \times 10^{-4}$ g/m$^2$day to about $1.0 \times 10^{-3}$ g/m$^2$day |

Figure 6B:
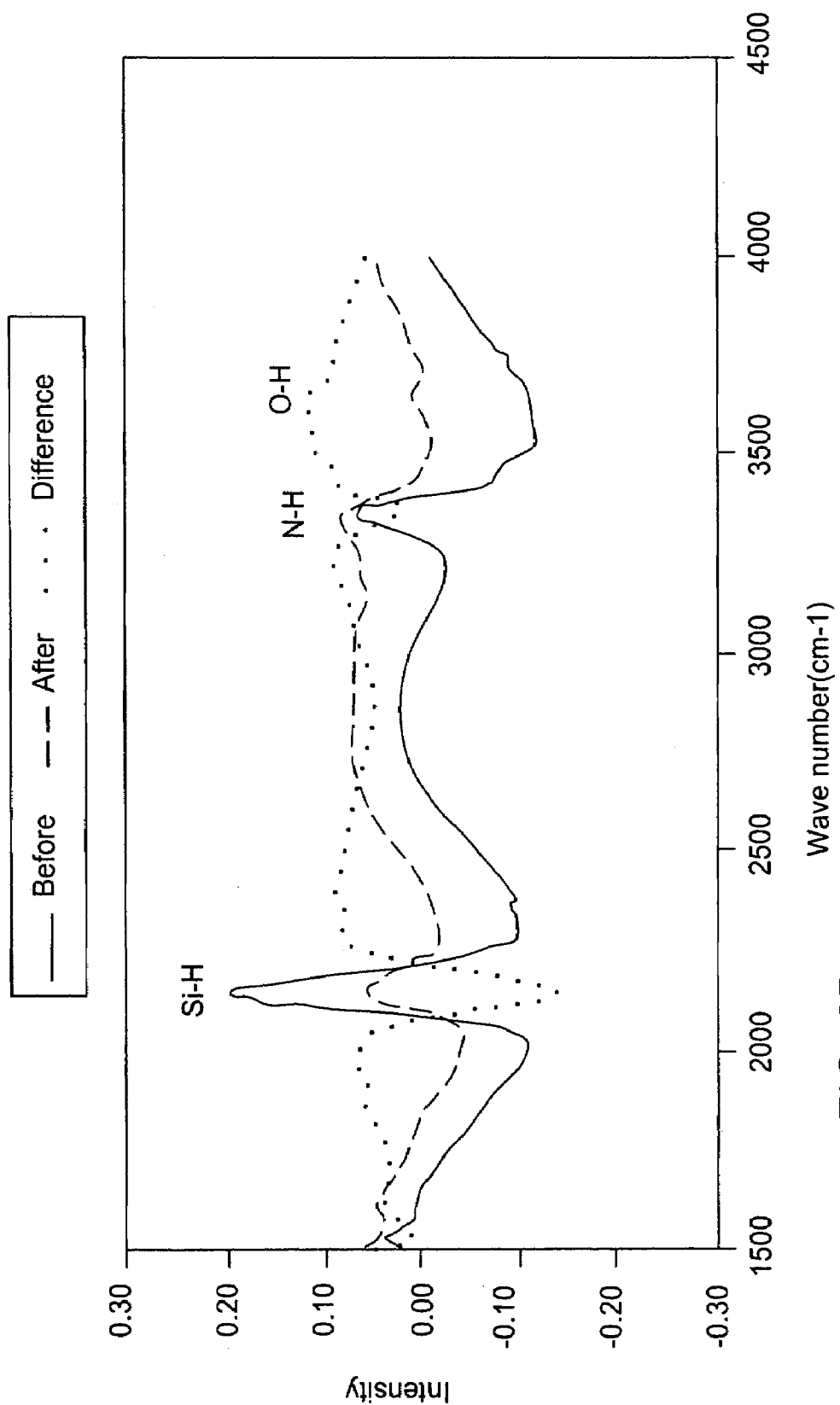
FIG. 6B illustrates the transmission fourier transform infrared spectra (FTIR) of the silicon nitride film deposited without hydrogen source gas.

As a comparison, FIG. 6B compares the transmission fourier transform infrared spectra (FTIR) change before (solid line) and after (broken line) water treatment for the SiN films deposited using prior art method without hydrogen source gas. The difference for each of the Si—H, N—H, and O—H bonds is shown as dotted line. The results demonstrated a big decrease in Si—H bond, a small decrease in N—H bond, and an small peak increase in O—H bond. The results of Table 1 and FIG. 6B also indicated that, there is about 15% change of refractive index for the SiN film deposited. In addition, higher water vapor transmission rate (WVTR) was measured after water test. All of which are indicative that the silicon nitride film deposited in the absence of hydrogen source gas exhibits poor water-barrier performance.

While the foregoing is directed to embodiments of the present invention, other and further embodiments of the invention may be devised without departing from the basic scope thereof, and the scope thereof is determined by the claims that follow.

The invention claimed is:

1. A method for depositing a material layer onto a substrate, comprising:
   placing the substrate in a process chamber;
   delivering a mixture of precursors for the material layer into the process chamber; subsequently
   delivering a hydrogen gas into the process chamber to improve water-barrier performance of the material layer;
   controlling the temperature of the substrate to a temperature of about 100° C. or lower;
   generating a plasma inside the process chamber; and depositing the material layer on the substrate.

2. The method of claim 1, wherein the deposited material layer with improved water-barrier performance has a water vapor transmission rate of no more than about $1 \times 10^{-2}$ grams per square meter per day.

3. The method of claim 1, wherein the temperature of the substrate is maintained at about 20° C. to about 80° C.

4. The method of claim 1, wherein the pressure of the process chamber is maintained at about 0.5 Torr to about 10 Torr.

5. The method of claim 1, wherein the precursors for the material layer comprise a silicon-containing gas.

6. The method of claim 5, wherein the silicon-containing gas is selected from the group consisting of silane, SiF$_4$, Si$_2$H$_6$, and combinations thereof.

7. The method of claim 1, wherein the precursors for the material layer comprise a nitrogen-containing gas.

8. The method of claim 7, wherein the nitrogen-containing gas is selected from the group consisting of ammonium, nitrous oxide (N$_2$O), nitric oxide (NO), nitrogen (N$_2$) and combinations thereof.

9. The method of claim 1, wherein the substrate is a material selected from the group consisting of semiconductor wafer, silicon-containing material, glass, plastic film, polyethylene terephthalate (PET), and polyethylene naphthalate (PEN).

10. The method of claim 1, wherein the plasma is generated by applying a power source selected from the group consisting of radiofrequency power, microwave frequency, and combinations thereof, and coupling to the process chamber in a way selected from the group consisting of inductively coupling and capacitively coupling.

11. A method for depositing an encapsulating layer onto a substrate, comprising:
    placing the substrate in a process chamber;
    delivering a mixture of precursors for the encapsulating layer into the process chamber; subsequently
    delivering a hydrogen gas into the process chamber;
    controlling the temperature of the substrate to a temperature of about 100° C. or lower;
    generating a plasma inside the process chamber; and
    depositing the encapsulating layer with water-barrier performance of a water vapor transmission rate of no more than about $1 \times 10^{-2}$ grams per square meter per day onto the substrate.

12. The method of claim 11, wherein the temperature of the substrate is maintained at about 20° C. to about 80° C.

13. The method of claim 11, wherein the precursors for the material layer comprise a material selected from the group consisting of silane, SiF$_4$, Si$_2$H$_6$, and combinations thereof.

14. The method of claim 11, wherein the precursors for the material layer comprise a nitrogen-containing gas.

15. The method of claim 14, wherein the nitrogen-containing gas is selected from the group consisting of ammonium, nitrous oxide (N$_2$O), nitric oxide (NO), nitrogen (N$_2$) and combinations thereof.

16. The method of claim 11, wherein the substrate is a material selected from the group consisting of semiconductor wafer, silicon-containing material, glass, plastic film, polyethylene terephthalate (PET), and polyethylene naphthalate (PEN).

17. The method of claim 11, wherein the plasma is generated by applying a power source selected from the group consisting of radiofrequency power, microwave frequency, and combinations thereof, and coupling to the process chamber in a way selected from the group consisting of inductively coupling and capacitively coupling.

18. A method for encapsulating a display device with a material layer, comprising:
   placing a substrate having the display device in a process chamber;
   delivering a mixture of precursors for the material layer into the process chamber; subsequently
   delivering a hydrogen gas into the process chamber to improve water-barrier performance of the material layer;
   generating a plasma in the chamber while maintaining the substrate at a temperature no greater than of about 100° C.; and
   depositing the material layer on the substrate.

19. The method of claim 18, wherein the deposited material layer has improved water-barrier performance with a water vapor transmission rate of no more about $1\times10^{-2}$ grams per square meter per day.

20. The method of claim 18, wherein the temperature of the substrate is maintained at about 20° C. to about 80° C.

21. The method of claim 18, wherein the precursors for the material layer comprise a silicon-containing gas.

22. The method of claim 21, wherein the silicon-containing gas is selected from the group consisting of silane, $SiF_4$, $Si_2H_6$, and combinations thereof.

23. The method of claim 18, wherein the precursors for the material layer comprise a nitrogen-containing gas.

24. The method of claim 23, wherein the nitrogen-containing gas is selected from the group consisting of ammonium, nitrous oxide ($N_2O$), nitric oxide (NO), nitrogen ($N_2$), and combinations thereof.

25. The method of claim 18, wherein the substrate is a material selected from the group consisting of semiconductor wafer, silicon-containing material, glass, plastic film, polyethylene terephthalate (PET), and polyethylene naphthalate (PEN).

26. A display device comprising an encapsulating layer, wherein the encapsulating layer is deposited by:
   delivering a mixture of precursors for the encapsulating layer into the process chamber; subsequently
   delivering a hydrogen gas into the process chamber to improve water-barrier performance of the material layer;
   generating a plasma in the chamber while maintaining the chamber at a temperature no greater than of about 100° C.; and depositing the encapsulating layer on the display device.

27. The display device of claim 26, wherein the deposited encapsulating layer has improved water-barrier performance with a water vapor transmission rate of less than about $1\times10^{-2}$ grams per square meter per day.

28. The display device of claim 26, wherein the temperature of the chamber is maintained at about 20° C. to about 80° C.

29. The display device of claim 26, wherein the precursors for the encapsulating layer comprise a silicon-containing gas.

30. The display device of claim 29, wherein the silicon-containing gas is selected from the group consisting of silane, $SiF_4$, $Si_2H_6$, and combinations thereof.

31. The display device of claim 26, wherein the precursors for the encapsulating layer comprise a nitrogen-containing gas.

32. The display device of claim 31, wherein the nitrogen-containing gas is selected from the group consisting of ammonium, nitrous oxide ($N_2O$), nitric oxide (NO), nitrogen ($N_2$), and combinations thereof.

* * * * *

UNITED STATES PATENT AND TRADEMARK OFFICE
CERTIFICATE OF CORRECTION

| | |
|---|---|
| PATENT NO. | : 7,220,687 B2 |
| APPLICATION NO. | : 10/876440 |
| DATED | : May 22, 2007 |
| INVENTOR(S) | : Tae Kyung Won |

Page 1 of 1

It is certified that error appears in the above-identified patent and that said Letters Patent is hereby corrected as shown below:

In Column 1, Line 37, please delete "serving" and insert --serving a--;

In Column 4, Line 17-18, please delete the second "polyethyleneterephthalate" and insert --polyethylenenaphthalate--;

In Column 8, Line 46, please delete "3-dimentional" and insert --3-dimensional--;

In Column 9, Line 43, please delete "an" and insert --a--.

Signed and Sealed this

Seventh Day of August, 2007

JON W. DUDAS
*Director of the United States Patent and Trademark Office*